(12) United States Patent
Tanaka (10) Patent No.: US 8,778,571 B2
(45) Date of Patent: Jul. 15, 2014

(54) METHOD OF MANUFACTURING EUV MASK

(75) Inventor: Toshihiko Tanaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 73 days.

(21) Appl. No.: 13/592,333

(22) Filed: Aug. 22, 2012

(65) Prior Publication Data

US 2013/0065163 A1 Mar. 14, 2013

(30) Foreign Application Priority Data

Sep. 12, 2011 (JP) ................................. 2011-198197

(51) Int. Cl.
*G03F 1/00* (2012.01)
*G03F 1/24* (2012.01)
*G03F 1/72* (2012.01)
G03F 1/82 (2012.01)
G03F 1/84 (2012.01)

(52) U.S. Cl.
CPC .. *G03F 1/24* (2013.01); *G03F 1/72* (2013.01); *G03F 1/82* (2013.01); *G03F 1/84* (2013.01)
USPC .......................................................... 430/5

(58) Field of Classification Search
CPC ............... G03F 1/24; G03F 1/72; G03F 1/82; G03F 1/84
USPC .................. 430/5; 382/144; 356/237.1–237.5
See application file for complete search history.

(56) References Cited

U.S. PATENT DOCUMENTS

| 2003/0067598 A1 | 4/2003 | Tomie |
| 2004/0057107 A1 | 3/2004 | Yun et al. |
| 2007/0091421 A1* | 4/2007 | Hosoya et al. ................. 359/359 |
| 2009/0253055 A1* | 10/2009 | Hayashi et al. .................... 430/5 |

FOREIGN PATENT DOCUMENTS

| JP | 6-349715 A | 12/1994 |
| JP | 2003-114200 A | 4/2003 |
| JP | 2007-109968 A | 4/2007 |
| JP | 2007-109971 A | 4/2007 |

* cited by examiner

*Primary Examiner* — Stewart Fraser
(74) *Attorney, Agent, or Firm* — McGinn IP Law Group, PLLC (57) ABSTRACT

Techniques for easily fabricating defect-free EUV masks with good yield are provided. A method of manufacturing an EUV mask according to the present invention includes the steps of: carrying out a defect inspection after depositing a multilayer film on a substrate; if a defect is found in the defect inspection, determining whether the defect is a recessed defect, a protruded defect, or defects in which the recessed defect and the protruded defect are mixed, and if the defects are the mixed defects of the recessed defect and the protruded defect, determining the relation in size between the defects; and depositing an additional multilayer film on the multilayer film while changing a film forming method in accordance with the results of the determination.

11 Claims, 5 Drawing Sheets

METHOD OF MANUFACTURING EUV MASK

CROSS-REFERENCE TO RELATED APPLICATION

The present application claims priority from Japanese Patent Application No. 2011-198197 filed on Sep. 12, 2011, the content of which is hereby incorporated by reference into this application.

TECHNICAL FIELD OF THE INVENTION

The present invention relates to techniques effectively applied to the manufacture of a mask that uses extreme ultraviolet (Extreme Ultra-Violet: hereinafter, referred to as EUV) as an exposure light source.

BACKGROUND OF THE INVENTION

Semiconductor devices such as semiconductor integrated circuit devices have been mass-produced by repeatedly using an optical lithography process in which a mask serving as a template having a circuit pattern drawn therein is irradiated with exposure light to transfer the circuit pattern onto a semiconductor substrate (hereinafter, referred to as "wafer") via a reduction optical system.

Recently, semiconductor devices have been more and more miniaturized, and methods of further shortening the exposure wavelength of optical lithography to improve resolution have been studied. More specifically, ArF lithography that uses argon fluoride (ArF) excimer laser light having a wavelength of 193 nm as a light source has been developed so far. However, in recent years, development of lithography that uses EUV light (wavelength=13.5 nm) having a much shorter wavelength has been underway.

In the wavelength region of the above-described EUV light, conventional optical-lithography transmissive masks cannot be used in relation to optical absorption of substances. Therefore, as a mask blank for EUV lithography, for example, a multilayer reflecting substrate utilizing reflection caused by a multi layer film, in which Mo (molybdenum) films and Si (silicon) films are alternately stacked, is used. The reflection caused by the multilayer film is the reflection that utilizes a type of interference.

An EUV lithography mask (hereinafter, referred to as EUV mask or simply mask) is composed of a multilayer-film blank in which stacked films of, for example, Mo films and Si films are deposited on a quartz substrate or low-thermal-expansion glass substrate (LTEM: Low Thermal Expansion Material) and an absorber pattern formed on the multilayer-film blank.

In EUV lithography, since the mask is a reflecting type and the exposure wavelength is as extremely short as 13.5 nm, even an extremely slight abnormality in height corresponding to a fraction of the exposure wavelength causes a local difference in the reflection rate, and a phase defect occurs in the pattern transferred onto a wafer.

Most of above-described phase defects are caused by pits created in substrate polishing and particles on a substrate which cannot be removed even by cleaning. These phase defects belong to opaque defects, and it is difficult to recover them because they are defects of a reflecting member.

In view of such facts, a method of depositing a polysilicon film or a multilayer film for planarization on a polished quartz substrate or low-thermal-expansion glass substrate and then forming a multilayer film serving as an original reflecting film on the film to fabricate a mask blank or mask has been known.

In the case of the method in which an original multilayer film is to be formed on a multilayer film for planarization, in order to vent the influence of the underlying multilayer film from appearing as changes in the reflection-rate level of EUV light or the local reflection rate, a method of applying thermal treatment to the underlying multilayer film to cause mixing at the interface of the two multilayer films (for example, see Japanese Unexamined Patent Application Publication No. 2007-109971 (Patent Document 1)), a method of providing an intermediate film composed of an absorber which suppresses reflection of EUV light between the two multilayer films for example, see Japanese Unexamined Patent Application Publication No. 2007-109968 (Patent Document 2)) and others have been proposed.

As typical methods of a mask-blank defect inspection carried out in a stage before a step of forming the absorber pattern on the multilayer film, a laser inspection method of obliquely irradiating a mask blank with laser light and detecting foreign matters from diffusely reflected light thereof and an exposure-wavelength (at wavelength or Actinic) defect inspection method of detecting defects by using EUV light having the same wavelength as the wavelength of exposure light have been known.

Furthermore, examples of the above-described exposure-wavelength defect inspection method include a method that uses a dark-field image (for example, see Japanese Unexamined Patent Application Publication No. 2003-114200 (Patent Document 3)), X-ray microscopy that uses a bright field (for example, see Japanese Unexamined Patent Application Publication No. 6-349715 (Patent Document 4)), and a dark-field bright-field combination method that detects defects by using a dark field and carries out defect identification with a bright-field system using a Fresnel zone plate (for example, see US Patent Application Publication No. 2004/0057107 (Patent Document 5)).

SUMMARY OF THE INVENTION

Not only in the case in which a multilayer film as an EUV-light reflecting film is simply formed on a substrate (quartz substrate, low-thermal-expansion glass substrate) of an EUV mask, but also in the case in which a film for planarization is deposited and formed in a layer below the multilayer film, the shape of the surface of the multilayer film deposited on a defect varies depending on whether the defect has a recessed shape (pit) or a protruded shape (bump).

More specifically, if the defect has a protruded shape, the surface of the multilayer film deposited on the defect can be planarized by utilizing a film forming method using, for example, a smoothing method. However, if the defect conversely has a recessed shape, this defect is rather expanded when this method is used.

On the other hand, if the defect has a recessed shape, the surface of the multilayer film deposited on the defect can be planarized by utilizing a film forming method using, for example, a conformal method. However, if the defect conversely has a protruded shape, the defect is rather expanded when this method is used.

Figure 2A:
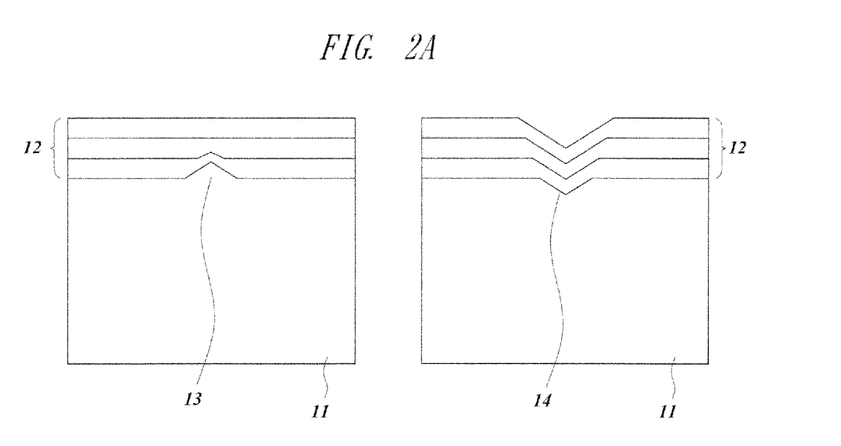
FIG. 2A is a schematic cross-sectional view showing a conventional defect correcting method of an EUV mask.
Figure 2B:
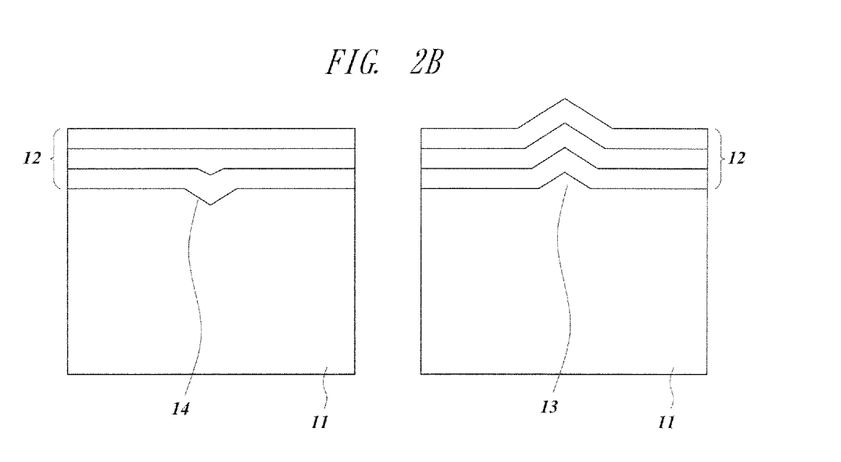
FIG. 2B is a schematic cross-sectional view showing a conventional defect correcting method of an EUV mask.

These states are shown in FIGS. 2A and 2B. FIG. 2A is a schematic cross-sectional view of the case in which the multilayer film is deposited by utilizing the film forming method using the smoothing method, and FIG. 2B is a schematic cross-sectional view of the case in which the multilayer film is deposited by utilizing the film forming method using the conformal method. Reference numeral 11 in the drawing denotes a substrate, 12 denotes the multilayer, 13 denotes a protruded defect, and 14 denotes a recessed defect.

In the case in which the protruded defect 13 is present, the surface of the substrate 11 is shown in the drawing as if it partially bulges. However, this is a schematic example, and in practice, a particle is placed on the substrate 11 in most cases. Also in those cases, the shape of the surface of the multilayer film 12 deposited on the protruded defect 13 tends to be the same as the case in which the surface of the substrate 11 itself partially bulges.

As described above, the conventional methods which correct phase defects caused in an EUV mask have not been satisfactory, including the case in which protruded defects and recessed defects are mixed on a single substrate. Therefore, in the present circumstances, if a phase defect occurs on a substrate, after a deposited multilayer film is detached to carry out polishing or cleaning of the surface of the substrate, a multilayer film has to be then deposited again to carry out an inspection. As a result, mask manufacturing process is complicated.

In addition, even when defects are corrected in such a manner, new defects often occur, for example, when the surface of the substrate is polished, which also causes a problem of the low manufacturing yield of masks. Particularly, since low-thermal-expansion glass which is a substrate material of EUV masks has high material cost and also requires extremely high flatness, EUV masks are extremely expensive.

An object of the present invention is to provide techniques for easily fabricating defect-free EUV masks with good yield.

The above and other objects and novel characteristics of the present invention will be apparent from the description of the present specification and the accompanying drawings.

The following is a brief description of an aspect of the typical invention disclosed in the present application.

The method of manufacturing an EUV mask according to an aspect of the present invention includes the steps of: (a) preparing a substrate; (b) depositing a first multilayer film on the substrate; (c) carrying out a defect inspection with respect to the substrate after the step (b); (d) if a defect is found as a result of the defect inspection, determining whether the defect is a recessed defect, a protruded defect, or mixed defects of a recessed defect and a protruded defect; (e) if the defects are the mixed defects of the recessed defect and the protruded defect, determining a relation in size between the defects; (f) depositing a second multilayer film on the first multilayer film while changing a film forming method in accordance with determination results of the step (d) and the step (e); and (g) forming an absorber pattern on the second multilayer film and forming an electrically conductive film on a back surface of the substrate.

The effects obtained by a typical embodiment of the invention disclosed in the present application will be briefly described below.

Defect-free EUV masks can be easily fabricated with good yield.

The manufacturing yield of semiconductor integrated circuit devices to which integrated circuit patterns are to be transferred by using the EUV masks can be improved.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments. Also, in some drawings used in the following embodiments, hatching is omitted even in a plan view so as to make the structure easy to see.

Figure 1:
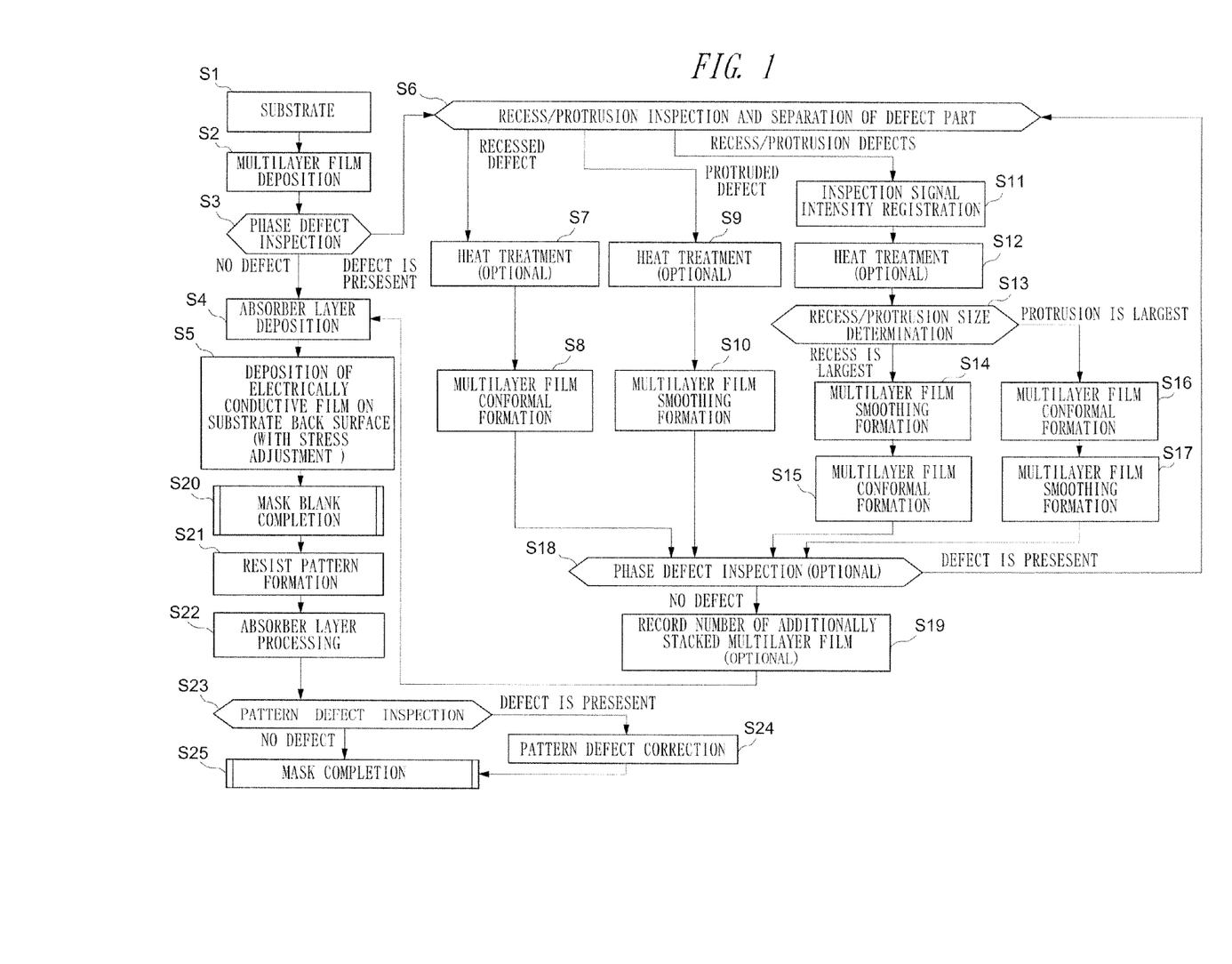
FIG. 1 is a flow chart showing a method of manufacturing an EUV mask which is an embodiment of the present invention.

A method of manufacturing an EUV mask, which is an embodiment of the present invention, will be described with reference to FIG. 1 (process flow chart) and FIG. 3 to FIGS. 5A and 5B (cross-sectional views showing main parts of mask blanks in main steps).

First, a substrate which has undergone polishing and cleaning in a normal method is prepared (step S1), and a multilayer film is deposited on the substrate (step S2). In this case, a low-thermal-expansion glass substrate is used as the substrate, but a substrate made of another material such as quartz glass may be used. Also, a stack in which 40 layers of Mo films and 40 layers of Si films are alternately stacked is used as the multilayer film, but the multilayer film is not limited thereto, and for example, a stack in which 50 to 60 layers of Mo films and 50 to 60 layers of Si films are alternately stacked may be used. Furthermore, depending on the exposure wavelength, materials other than Mo and Si can also be used as the materials of the multilayer film.

Then, after a capping layer composed of, for example, a Si film, a Ru film, or a Cr film is formed on the above-described multilayer film, a phase defect inspection (step S3) is carried out to check presence of phase defects, and if there is a defect, the positional information thereof is stored. In this case, a dark-field inspection method using the light (EUV light having a wavelength of 13.5 nm) having the same wavelength as that of exposure light is employed as a method of the phase defect inspection.

In addition to its high phase defect inspection sensitivity, the dark-field inspection method has a characteristic that the signal intensity thereof is correlated to the volume of a defect. As another method of the phase defect inspection, for example, an optical inspection method using far-ultraviolet (Deep UV) light can be employed.

If no defect is found as a result of the above-described phase defect inspection, an absorber layer is deposited on the capping layer by a normal method (step S4). Subsequently, an electrically conductive film is deposited on a back surface of the substrate (step S5) to complete the fabrication of a mask blank (step S20). In some cases, the fabrication of the mask blank is completed by applying a resist onto the surface of the mask blank after depositing the electrically conductive film.

In this case, a TaBN film is used as the absorber layer. However, any other material such as a TaN film or a WN film can be used as long as exposure light can be sufficiently reduced or shielded. Also, it is desirable that after the absorber layer is deposited, the surface thereof is subjected to an oxidation reforming treatment or the like to adjust the characteristics of reflection rate with respect to far-ultraviolet light for pattern inspection. Furthermore, in accordance with needs, a buffer layer for protecting the multilayer film in pattern defect correction may be formed between the capping layer and the absorber layer.

The electrically conductive film on the back surface of the substrate is provided for adsorbing a mask onto a mask stage of an exposure apparatus by an electrostatic adsorption method. In this case, a Cr film or a CrN film is used as the electrically conductive film, but the electrically conductive film is not limited thereto. When depositing the electrically conductive film, the stress of the film is adjusted so that flatness required for the mask blank can be obtained.

On the other hand, if a defect is found as a result of the above-described phase defect inspection (step S3), it is determined whether the defect is a recessed defect (pit) or a protruded defect (bump) (step S6). Specifically, changes in the inspection signal intensity at a defective part are measured by changing focus of a defect inspection apparatus, and the type of the defect is determined based on the focusing position at which the inspection signal intensity is the maximum. This inspection method is preferred because this is a non-contact inspection, but recess or protrusion of the defect can be determined by using a method other than that, for example, by an atomic force microscope (AFM: Atomic Force Microscope).

Then, if the found defect is only a recessed defect, heat treatment (step S7) is carried out to reduce the reflection rate of the multilayer film with respect to exposure light, and then, a multilayer film is deposited on the multilayer film by a conformal film forming method (step S8).

In this case, the temperature of the heat treatment is 250° C. However, the temperature is not limited thereto as long as it is within a temperature range where mixing occurs at the interfaces between the Mo films and the Si films and the reflection rate of the multilayer film with respect to exposure light is reduced to a desired level (level at which no problem is caused in defect transfer). The temperature at which this mixing starts is 150° C., and the temperature higher than this temperature is preferred because mixing is advanced and planarization of the surface of the multilayer film is promoted.

The above-described heat treatment is not an essential step and can be omitted depending on the number of pairs (the number of pairs of the Mo films and the Si films) of the multilayer film deposited on the multilayer film by the conformal film forming method. More specifically, this is because when the number of the pairs of the Mo films and the Si films reaches 60 or more, the influence exerted from the layer below there is eliminated.

Figure 3:
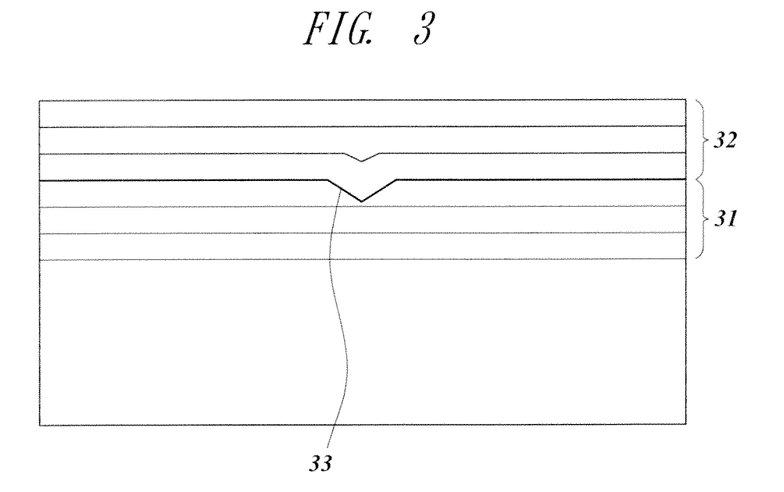
FIG. 3 is a cross-sectional view showing a main part of a mask blank in step S8 of FIG. 1.

In this case, an oblique deposition sputtering method in which a target material is obliquely injected to the substrate is employed as the method for conformal deposition of the multilayer film. By employing this method, as shown in FIG. 3 (cross-sectional view taken during the deposition of the multilayer film of step S8), a multilayer film 32 having a flat surface is formed on an underlying multilayer film 31 in which a recessed defect 33 is present.

In order to carry out sufficient defect correction while keeping the constant reflection rate of the exposure light (EUV light) at the defective part, it is desirable to further deposit a multilayer film of 40 or more pairs after the surface of the multilayer film is sufficiently planarized.

If the defect found in step S6 is only a protruded defect, after heat treatment (step S9) is carried out so as to reduce the reflection rate of the multilayer film with respect to exposure light, a multilayer film is deposited on the multilayer film by utilizing a film forming method using a smoothing method (step S10). The purpose of the heat treatment of step S9 is the same as that of the heat treatment of step S7 described above, and heating conditions are also the same. The point that the heat treatment can be omitted depending on conditions is also the same.

Figure 4:
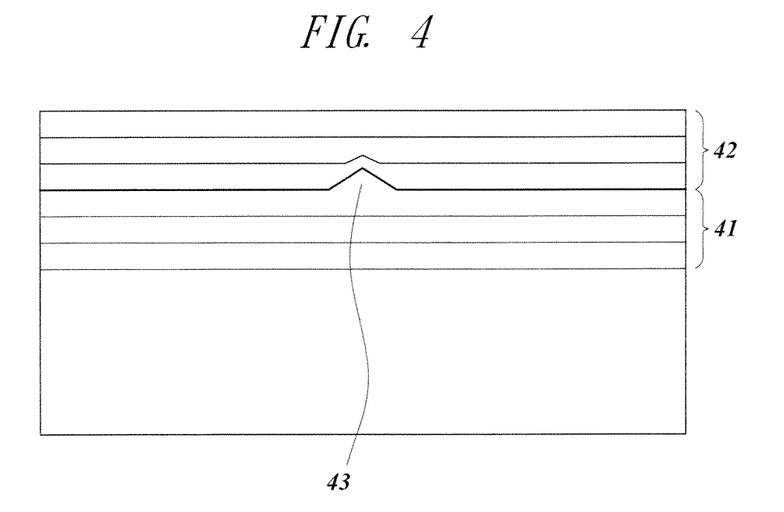
FIG. 4 is a cross-sectional view showing a main part of the mask blank in step S10 of FIG. 1.

In this case, a sputtering method in which a target material is vertically injected to the substrate is employed as the film forming method using the smoothing method. By employing this method, as shown in FIG. 4 (cross-sectional view taken during the deposition of the multilayer film of step S10), a multilayer film 42 having a flat surface is formed on an underlying multilayer film 41 in which a protruded defect 43 is present.

Also in this case, in order to carry out sufficient defect correction while keeping the constant reflection rate of the exposure light (EUV light) at the defective part, it is desirable to further deposit a multilayer film of 40 or more pairs after the surface of the multilayer film is sufficiently planarized.

If it is found out in step S6 that both a protruded defect and a recessed defect are present, the intensity of the inspection signal of each of the defects is registered (step S11), and heat treatment (step S12) is subsequently carried out so as to reduce the reflection rate of the multilayer film with respect to exposure light. The purpose of the heat treatment of step S12 is the same as that of the heat treatment of steps S7 and S9 described above, and heating conditions are also the same. Moreover, the point that the heat treatment can be omitted depending on conditions is also the same.

Then, the size (volume) of each of the defects is determined (step S13). In this case, the intensity of the inspection signal registered in step S11 is utilized for a determination method of the size of the defects, and the defect is determined to be larger as the intensity of the inspection signal becomes higher. As another determination method, volume evaluation of the defective part using an atomic force microscope (ATM) can also be utilized, but from the viewpoint of reducing the number of steps and reducing the time of steps, it is preferred to utilize the intensity of the inspection signal acquired in a previous step (S11).

If it is determined in step S13 that the largest defect is a recessed defect, a multilayer film is first deposited by utilizing a film, forming method using the smoothing method (step S14), and then, a multilayer film is further deposited by a conformal film forming method (step S15). As the film forming method using the smoothing method, a sputtering method in which a target material is vertically injected to the substrate is employed, and as the conformal film forming method, an oblique deposition sputtering method in which a target material is obliquely injected to the substrate is employed.

Figure 5A:
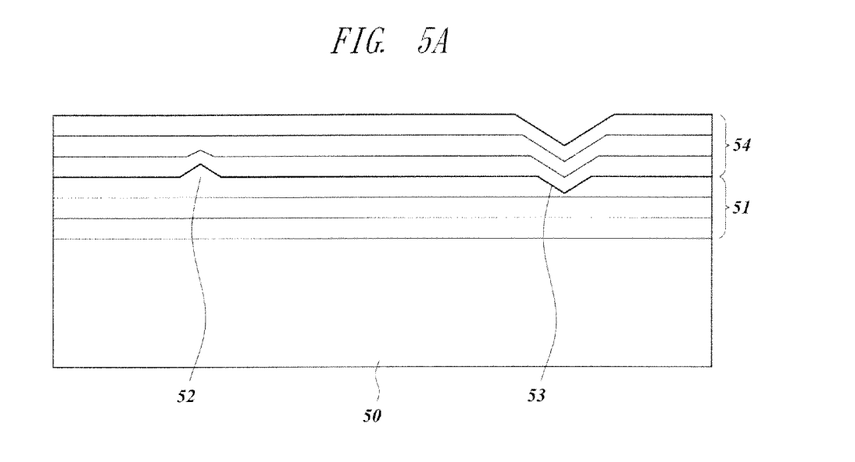
FIG. 5A is a cross-sectional view showing a main part of the mask blank in step S14 of FIG. 1.

When the multilayer film is deposited by the film forming method using the smoothing method, as shown in FIG. 5A, the surface of a multilayer film 54 on a protruded defect 52 which is relatively small compared with a recessed defect 53 is planarized at a comparatively small film thickness, but a dent on the surface of the multilayer film 54 is expanded above the largest recessed defect 53. Reference numeral 50 in the drawing denotes a substrate, and 51 denotes an underlying multilayer film.

Figure 5B:
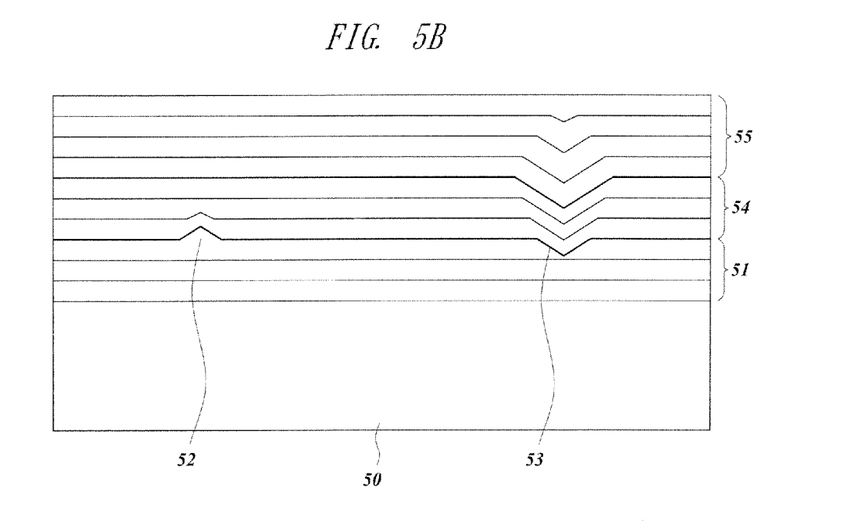
FIG. 5B is a cross-sectional view showing a main part of the mask blank in step S15 of FIG. 1.

Subsequently, when a multilayer film 55 is further deposited by the conformal film forming method, as shown in FIG.

5B, the surface of the multilayer film 55 is planarized even above the recessed defect 53. At this time, since the surface of the multilayer film 54 has already been planarized above the protruded defect 52 because of the film formation by the smoothing method, the surface of the multilayer film 55 is also planarized. As a result, the entire surface of the mask blank is planarized.

Also in this step (S15), in order to carry out sufficient defect correction while keeping the constant reflection rate of exposure light at the defective part, it is desirable to further deposit another multilayer film 55 of 40 pairs or more after the surface of the multilayer film 55 is sufficiently planarized.

On the other hand, if the order of the above-described film forming processes is reversed to deposit the multilayer film by the conformal film forming method first, the surface of the multilayer film is planarized above the recessed defect, but a bulge on the surface of the multilayer film is expanded above the protruded defect.

Since it is necessary to deposit a multilayer film having a large film thickness in order to planarize the multilayer film on the recessed defect, correspondingly, the bulge on the surface of the multilayer film is increased above the protruded defect. Therefore, in order to planarize the largely-bulged surface of the multilayer film, a multilayer film having a large film thickness has to be deposited thereafter by a film forming method using the smoothing method.

As described above, if the order of the above-described film forming processes is reversed, a multilayer film having a larger film thickness has to be deposited as a whole, which causes the increase in occupation time of the film forming apparatus per one mask blank and the increase in the defect occurrence rate due to the increase in the film thickness of the multilayer film.

On the other hand, if it is determined in step S13 that the largest defect is a protruded defect, a multilayer film is deposited by a conformal film forming method first (step S16), and then, a multilayer film is deposited by a film forming method using the smoothing method (step S17). As a result, the surface of the multilayer film can be planarized at a comparatively small film thickness.

After the surface of the multilayer film is planarized by the above-described method, a phase defect inspection is carried out again to check the presence of defects (step S18). If a defect is found, the above-described processes of step S6 and thereafter are repeated so as to planarize the surface of the multilayer film.

On the other hand, if no defect is found in the inspection of step S18, the number of the pairs of the multilayer film added in any of steps S8, S10, S14, S15, S16, and S17 is recorded (step S19). This is because since the thickness of the mask blank or mask is correspondingly increased when the multilayer film is added, the influence thereof should be reflected to the exposure apparatus so as to carry out good transfer. In other words, the height of the mask stage has to be adjusted in accordance with the film thickness of the added multilayer film so that the influence is not exerted on the transfer.

The phase defect inspection of step S18 and the recording operation of step S19 described above are not essential, but can be omitted.

Then, an absorber layer is deposited on the multilayer film by a normal method (step S4), and an electrically conductive film is subsequently deposited on the back surface of the substrate (step S5), thereby completing fabrication of a mask blank (step S20). In some cases, the fabrication of the mask blank is completed when a resist is applied onto the surface of the mask blank after the formation of the electrically conductive film.

In this case, a TaBN film is used as the absorber layer, but another material such as a TaN film or a WN film can be used as long as exposure light can be sufficiently reduced or shielded. Also, it is desirable that after the absorber layer is deposited, the surface thereof is subjected to an oxidation reforming treatment or the like to adjust the characteristics of reflection rate with respect to far-ultraviolet light for pattern inspection. Furthermore, in accordance with needs, a buffer layer for protecting the multilayer film in pattern defect correction may be formed between the capping layer and the absorber layer.

The electrically conductive film on the back surface of the substrate is provided for adsorbing a mask onto a mask stage of an exposure apparatus by an electrostatic adsorption method, and it is composed of, for example, a Cr film or a CrN film. However, the electrically conductive film is not limited thereto. Also, when depositing the electrically conductive film, the stress of the film is adjusted so that flatness required for the mask blank can be obtained.

Then, a resist pattern is formed on the absorber layer (step S21), and the absorber layer is processed (patterned) with using this resist pattern as a mask, thereby forming a circuit pattern to be transferred onto a wafer (step S22).

Then, a pattern defect inspection of the absorber pattern is carried out (step S23). If no pattern defect is found, the fabrication of the mask is completed (step S25). On the other hand, if a pattern defect is found, after the pattern defect correction using a normal method (step S24), the fabrication of the mask is completed (step S25).

Figure 6A:
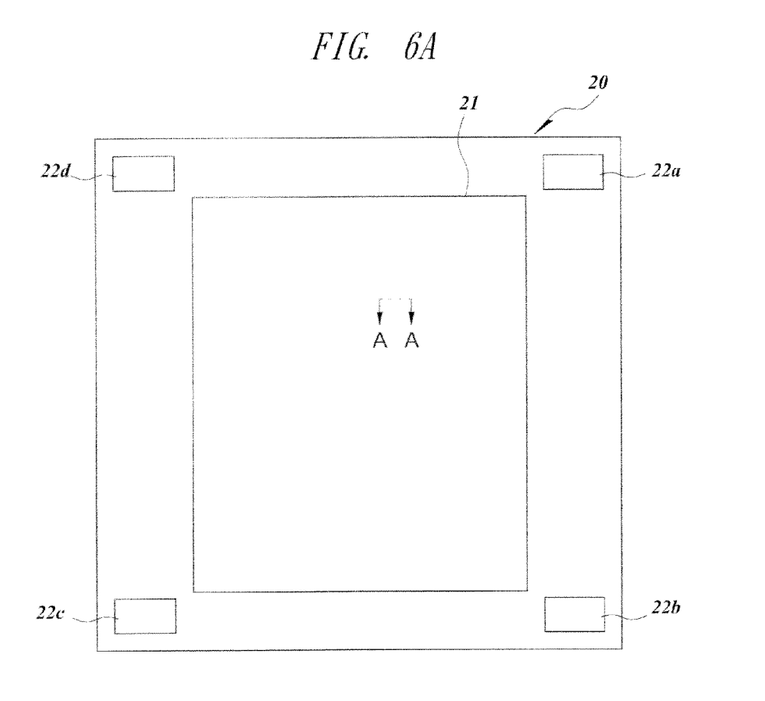
FIG. 6A is a plan view of an EUV mask manufactured by a method of the present invention.

FIG. 6A is a plan view of an EUV mask manufactured in accordance with the steps described above, and FIG. 6B is a cross-sectional view taken along the line A-A of FIG. 6A.

A device pattern area 21 is disposed at a center part of an upper surface (pattern surface) of the EUV mask 20. Although illustration is omitted, a semiconductor integrated circuit pattern to be transferred to a wafer is formed in this device pattern area 21. Also, alignment mark areas 22a, 22b, 22c, and 22d in which marks for position adjustment of the EUV mask 20, wafer alignment marks, and others are formed are disposed outside the device pattern area 21.

Figure 6B:
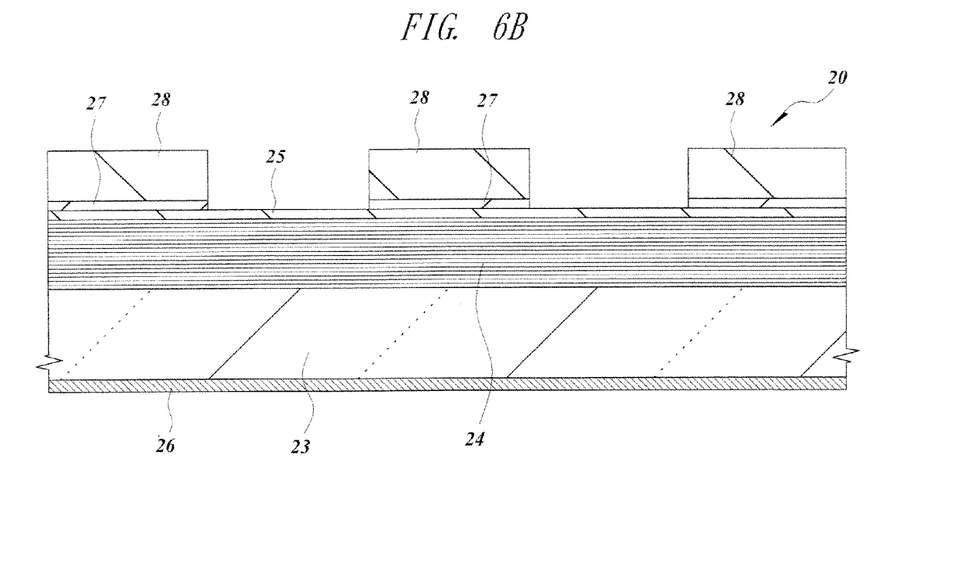
FIG. 6B is a cross-sectional view taken along the line A-A of FIG. 6A.

The mask blank of the EUV mask 20 is composed of: a substrate 23 made of quartz glass or low-thermal-expansion glass; a multilayer film 24 formed on a main surface of the substrate 23 and having Mo films and Si films stacked alternately; a capping layer 25 formed on the multilayer film 24, and an electrically conductive film 26 formed on the back surface of the substrate 23 in order to adsorb the EUV mask 20 onto a mask stage by the electrostatic adsorption method.

Furthermore, on an uppermost layer (capping layer 25) of the mask blank, an absorber pattern 28 is formed via a buffer layer 27. The integrated circuit pattern in the device pattern area 21 and various marks in the alignment mark areas 22a to 22d described above are composed of the absorber pattern 28.

The above-described buffer layer 27 is a barrier layer for preventing the underlying multilayer film 24 and others from being damaged and preventing the attachment of contamination thereto in the correction of the absorber pattern 28 using FIB (Focus Ion Beam), and the buffer layer 27 on a reflecting surface on which the absorber pattern 28 is not formed is removed in a last stage of the mask manufacturing process. However, in the case in which EB (Electron Beam) correction or the like is used, this buffer layer 27 (barrier layer) can be omitted.

Although illustration is omitted, a film whose reflection rate with respect to defect inspection light having a wavelength of near 250 nm or near 193 nm is suppressed is formed on the surface of the absorber pattern 28 so that a semiconductor defect inspection can be carried out at high sensitivity by, for example, oxidation treatment.

As described above, according to the present embodiment, defect-free EUV masks can be easily fabricated with good yield, and therefore, the manufacturing cost of the EUV masks can be reduced.

Therefore, the manufacturing yield of semiconductor integrated circuit devices to which integrated circuit patterns are to be transferred by using the EUV masks can be improved.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention can be utilized in phase defect correction of lithography masks using EUV as an exposure light source.

What is claimed is:

1. A method of manufacturing an EUV mask comprising at least a substrate, a multilayer film formed on the substrate, an absorber pattern formed on the multilayer film, and an electrically conductive film formed on a back surface of the substrate, the method comprising:
   (a) preparing the substrate;
   (b) depositing a first multilayer film on the substrate;
   (c) carrying out a defect inspection with respect to the substrate after (b);
   (d) performing, depending on a result of the defect inspection:
      (d1) in a case where defects comprise mixed defects including a recessed defect and a protruded defect and a largest defect among the mixed defects is the recessed defect, a second multilayer film is deposited on the first multilayer film by using a film forming method using a smoothing method and a third multilayer film is deposited on the second multilayer film by using a film forming method using a conformal method; and
      (d2) in a case where defects comprise the mixed defects and a largest defect among the mixed defects is the protruded defect, a fourth multilayer film is deposited on the first multilayer film by using the film forming method using the conformal method and a fifth multilayer film is further deposited on the fourth multilayer film by using the film forming method using the smoothing method; and
   (e) forming the absorber pattern on the third multilayer film or the fifth multilayer film, and forming the electrically conductive film on the back surface of the substrate.

2. The method of manufacturing the EUV mask according to claim 1,
   wherein in (c), a change in a signal intensity at a part where the defect is present is measured by changing a focus of a defect inspection apparatus, and a type of the defect is determined based on a position of the focus where the signal intensity is a maximum.

3. The method of manufacturing the EUV mask according to claim 2,
   wherein in (c), the relation in size between the defects is determined based on the signal intensity.

4. The method of manufacturing the EUV mask according to claim 1,
   wherein when a defect is found as a result of the defect inspection carried out in (c), heat treatment is carried out before (e), thereby reducing a reflection rate of the first multilayer film with respect to exposure light.

5. The method of manufacturing the EUV mask according to claim 1,
   wherein each of the first, second, third, fourth and fifth multilayer films comprise a multilayer film in which Mo films and Si films are alternately stacked in a plurality of layers.

6. The method of manufacturing the EUV mask according to claim 1, wherein the absorber pattern comprises a TaBN film, a TaN film or a WN film.

7. The method of manufacturing the EUV mask according to claim 1, wherein the electrically conductive film comprises a Cr film or a CrN film.

8. The method of manufacturing the EUV mask according to claim 1, wherein the film forming method using the conformal method comprises an oblique deposition sputtering method in which a target material is obliquely injected to the substrate.

9. The method of manufacturing the EUV mask according to claim 1, wherein the film forming method using the smoothing method comprises a sputtering method in which a target material is vertically injected to the substrate.

10. The method of manufacturing the EUV mask according to claim 1, wherein a size of one or more of the recessed defect and the protruding defect is determined based on an intensity of an inspection signal.

11. The method of manufacturing the EUV mask according to claim 10, wherein a greater value of the intensity of the inspection signal corresponds to a greater value of the size of the one or more of the recessed defect and the protruding defect.

* * * * *